(12) United States Patent
Umotoy et al.

(10) Patent No.: US 6,302,965 B1
(45) Date of Patent: Oct. 16, 2001

(54) DISPERSION PLATE FOR FLOWING VAPORIZES COMPOUNDS USED IN CHEMICAL VAPOR DEPOSITION OF FILMS ONTO SEMICONDUCTOR SURFACES

(75) Inventors: Salvador Umotoy, Amtioch; Vincent Ku, San Jose; Xiaoxiong Yuan, Cupertino; Lawrence Chung-Lai Lei, Milpitas, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/638,506

(22) Filed: Aug. 15, 2000

(51) Int. Cl.[7] .................................................. C23C 16/00
(52) U.S. Cl. ............................................................. 118/715
(58) Field of Search ................................................ 118/715

(56) References Cited

U.S. PATENT DOCUMENTS

| | | | | |
|---|---|---|---|---|
| 5,284,519 | * | 2/1994 | Gadgil | 118/715 |
| 6,036,783 | * | 3/2000 | Fukunaga | 118/715 |
| 6,179,920 | * | 1/2001 | Tarutani | 118/715 |
| 6,210,485 | * | 4/2001 | Zhao | 118/715 |

* cited by examiner

*Primary Examiner*—Richard Bueker
(74) *Attorney, Agent, or Firm*—Ostroff & Associates

(57) ABSTRACT

A dispersion plate for evenly flowing at low pressure into a processing chamber vaporized material, such as a tungsten compound for deposition of metal layers onto a semiconductor, has a disc-like body with a center axis, an input face and an output face. The dispersion plate has a cup-like entrance along the center axis in its input face for receiving a stream of vaporized material and a plurality of passages for flow of vapor with each passage having a length and a diameter and extending radially from the entrance like the spokes of a wheel at inclined angles relative to the center axis from the input face to the output face. Two annular grooves are cut into the output face and intersect with the respective ends of the passages. The plate has a center hole with a flared diameter extending along the center axis from the entrance in the input face to the output face. The hole and plurality of passages are designed to have sufficiently large diameters so as to keep pressure drops low with respect to vapor flowing through the plate.

16 Claims, 3 Drawing Sheets

US 6,302,965 B1

DISPERSION PLATE FOR FLOWING VAPORIZES COMPOUNDS USED IN CHEMICAL VAPOR DEPOSITION OF FILMS ONTO SEMICONDUCTOR SURFACES

FIELD OF THE INVENTION

This invention relates to a dispersion plate for gasses, such as vaporized tungsten hexacarbonyl, flowing through the plate into a reaction chamber to deposit by chemical vapor deposition metal films on a surface of a semiconductor wafer.

BACKGROUND OF THE INVENTION

The widespread use of semiconductors is due to their usefulness, their cost effectiveness and to their unique capabilities. Accompanying the growth in the use, and usefulness, of semiconductors is the development of new processes and materials for the design and manufacture of semiconductors together with new or improved manufacturing equipment and hardware. An important recent development is the use of copper (which has about twice the unit conductivity of more commonly used aluminum) for electrical interconnections, or circuit traces within very large scale integrated circuits (VLSIs). The use of copper has permitted faster speeds of operation and greater capability of the VLSI circuits but has led to the need to prevent atoms of copper in the copper circuits from adversely interacting with atoms of other materials used in the VLSIs. One way of preventing such interactions is to provide a "barrier" layer over and/or under the copper, such as a thin layer of tungsten (W).

It is known that a layer of a material such as tungsten can be deposited by chemical vapor deposition (CVD) onto exposed surfaces of a semiconductor wafer during processing into VLSIs. Tungsten, which is a relatively heavy metal having an atomic weight of 183.86, has high temperature resistance and provides suitable protection against the reaction of copper with other materials during the fabrication of VLSIs. A compound of tungsten, namely tungsten hexacarbonyl [$W(CO)_6$], can be vaporized under suitable conditions of pressure and temperature to obtain a gaseous phase of the compound which can then be used in CVD processing to form a film or layer of metallic tungsten on a semiconductor wafer. This will be explained in greater detail hereinafter.

It is desirable that a layer of metal (such as tungsten) being deposited by CVD on a semiconductor wafer be uniform in thickness. To achieve this, a chemical vapor compound of the material flowing into a reaction chamber where the semiconductor wafer is being processed should be controlled in flow direction and amplitude so that the vapor is evenly distributed and flows uniformly toward the wafer. This is especially true of a material such as tungsten hexacarbonyl vapor, the molecules of which have relatively high weight and inertia. In addition, because a CVD process step using a compound such as tungsten hexacarbonyl is typically carried out in a reaction chamber maintained under low pressure conditions (e.g., a small fraction of a Torr), the flow of gas vapor into the chamber through a dispersion plate should have high-flow-conductance so that pressure drop across it is relatively low. The gas vapor should also be controlled in temperature as it passes through the plate and enters the chamber to prevent condensation of the vapor.

It is desirable to have a simple and efficient dispersion plate which fills the above described needs.

SUMMARY OF THE INVENTION

In accordance with the invention in one specific embodiment thereof, there is provided a dispersion plate for applying vapors of materials useful in chemical vapor deposition in the processing of semiconductors. The dispersion plate comprises a body having a center axis, an outer diameter, an input face, an output face, and a thickness between the faces with an entrance along the center axis in the input face for receiving a stream of vaporized material. The plate defines a plurality of passages through the plate for flow of vapor, each passage having a length and a diameter and extending radially from the center axis at respective inclined angles from the input face to the output face. The plate further defines a hole having a diameter and extending along the center axis from the entrance in the input face to the output face. The hole and plurality of passages have sufficiently large diameters to result in a relatively low pressure drop to the vapor flowing through them and to provide dispersion of vapor flowing through the plate such that vapor flows evenly onto the surface of the semiconductor body.

A better understanding of the invention together with a fuller appreciation of its many advantages will best be gained from a study of the following description given in conjunction with the accompanying drawings and claims.

The drawings are not necessarily to scale.

DETAILED DESCRIPTION OF THE DRAWINGS

Figure 1:
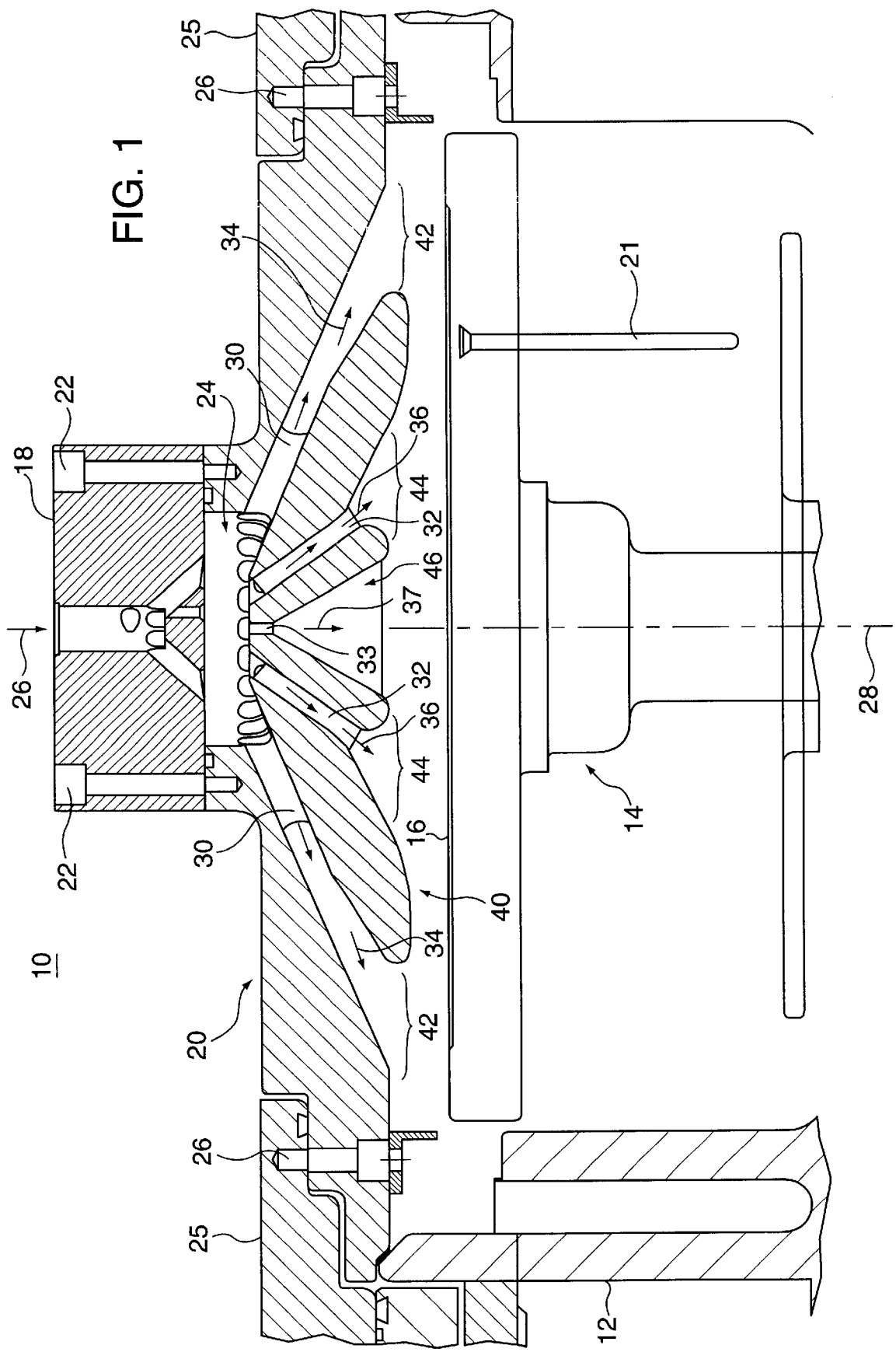
FIG. 1 is a cross-sectional view of semiconductor processing apparatus, partially broken away, including a high-flow-conductance dispersion plate embodying features of the invention.

Referring now to FIG. 1, there is shown in cross-section and partially broken away, an apparatus 10 useful in chemical vapor deposition (CVD) of materials onto semiconductor wafers. The apparatus 10 comprises a processing chamber 12 (of which only a part is shown), a susceptor or platform 14, a semiconductor wafer (body) 16 positioned on the platform 14 for CVD processing, a manifold 18, and a dispersion plate 20 embodying features of the invention for controlling and directing the flow of vaporized (gaseous) material into the chamber 12 so that it flows uniformly down toward the wafer 16. The chamber 12, is hermetically sealable and can be maintained at sub-atmospheric pressure. The wafer 16, after being inserted into the chamber 12, is lowered onto the platform 14 to the position shown by pins 21 (only one of which is shown). The pins 21 are vertically movable up and down on command on insertion or removal of the wafer 16. The platform 14 may be movable vertically as well. The platform 14 is heated (by means not shown) and in turn heats the wafer 16 to an elevated temperature (e.g., about 400° C.) At such temperature vaporized material flowing into the chamber 12 upon reaching and touching the surface of the wafer 16 will break down into its constituents and a tungsten film is deposited onto a top surface of the wafer 16. Unwanted residues and gas are exhausted from the chamber 12 via an exit port (not shown).

The manifold 18 supplies vaporized material to the dispersion plate 20 and is attached by bolts 22 to the plate 20 at a cup-shaped entrance 24 in the dispersion plate 20. The manifold 18 (well known in the art) may if deemed desirable apply heat and ultrasonic energy to material (indicated by an arrow 26) flowing to it from a source (not shown) to ensure that vaporized material flowing into the entrance 24 is entirely vaporized and free of droplets or particles.

The dispersion plate 20, in the specific embodiment illustrated herein, has in accordance with one feature of the invention high-flow-conductance, that is, low pressure drop across the plate of the vapor flowing through it. This enables the plate 20 to function well in CVD processing using materials such as tungsten hexacarbonyl $[W(CO)_6]$ where the pressure within the chamber 12 must be maintained at a low value (e.g., about 50 milli-Torr). In accordance with another feature of the invention, the plate 20 is configured to control and direct the flow of a relatively heavy vapor, such as tungsten hexacarbonyl, so that the vapor flows from the plate 20 uniformly onto the wafer 16. This helps ensure that a film (e.g., of tungsten) being deposited onto the wafer 16 has improved uniformity across the wafer 16. The dispersion plate 20 is advantageously made from a disc-like solid block of a metal such as aluminum having high heat conductivity and ease of machining. The plate 20 is attached to an upper wall 25 of the processing chamber 12 by a plurality of bolts 26, (only two of which are shown) and together with the wall 25 forms a top seal for the chamber 12.

As will be explained in greater detail hereinafter, the dispersion plate 20 has a center axis 28 and has drilled through it a number of radially extending passages 30 and 32 and a center hole 33. Vaporized material from the manifold 18 flowing into the entrance 24 flows through the plate 20 along the passages 30, 32, and hole 33 as indicated by the respective arrows 34, 36, and 37. The plate 20 has an output face, generally indicated at 40, which has cut into it an annular groove, near the outer diameter of the plate 20 and indicated by brackets 42, a smaller diameter annular groove, indicated by brackets 44, and a flared opening or funnel 46 beneath the center hole 33.

The passages 30 in the plate 20 extend radially from the center axis 28 like the individual spokes of a wheel. The passages 30 are each inclined at a uniform downward angle relative to the axis 28 and each has a diameter larger than that of the passages 32. The latter similarly extend like the spokes of a wheel and are inclined downward at an angle smaller than the inclined angle of the passages 30. The diameter of the center hole 33 is smaller than that of the passages 32. The particular shapes and configurations of the center hole 33, funnel 46, the passages 30 and 32, and of the grooves 42 and 44 in the output face 40 of the dispersion plate 20, in the specific embodiment of the invention illustrated herein, ensure that a vaporized material, such as tungsten hexacarbonyl, flowing into the chamber 12 will flow evenly down toward the wafer 16. An important result of this is that a thin layer of material (e.g., tungsten metal less than a micron thick) can be deposited with improved uniformity across the surface of the wafer 16.

Figure 2:
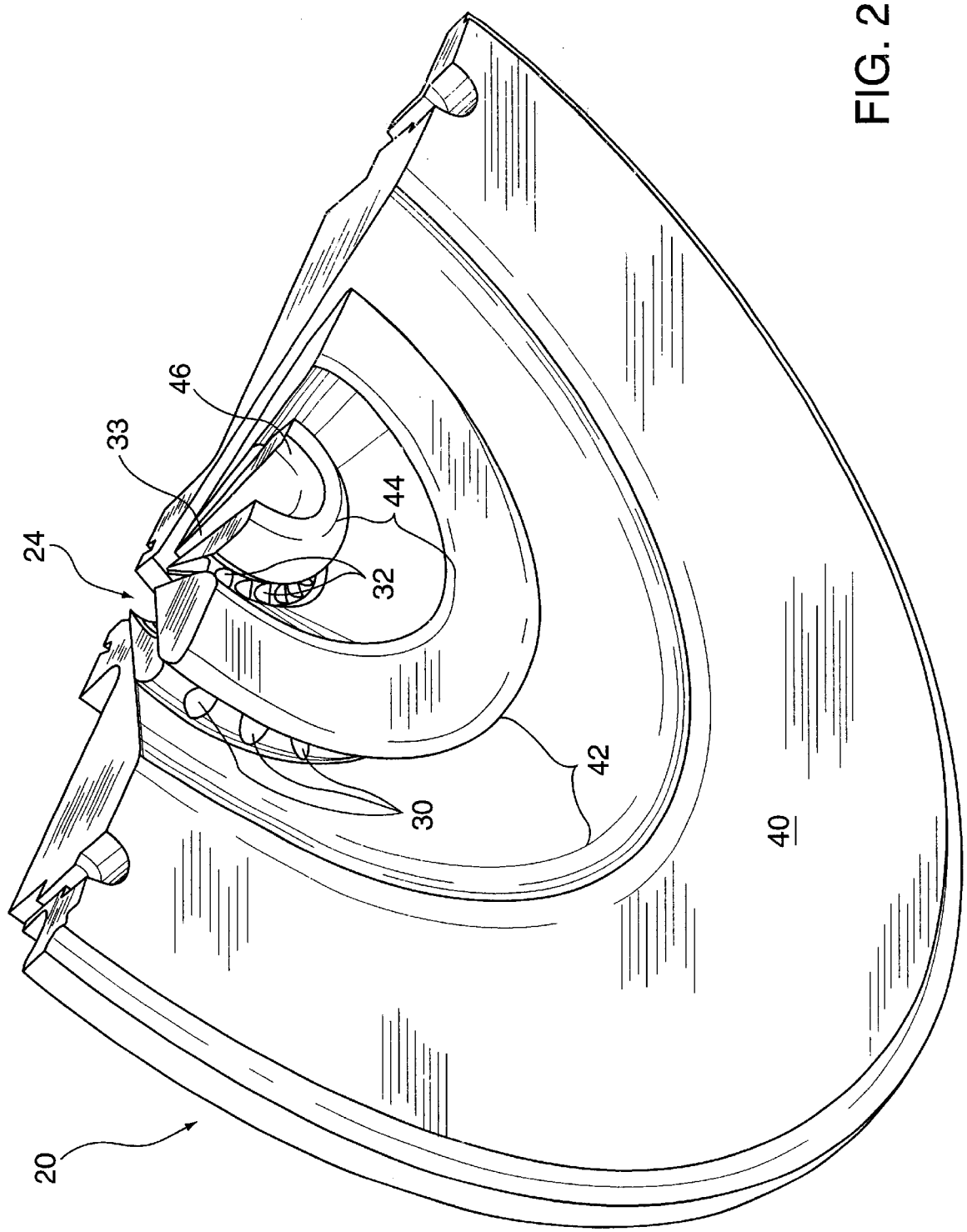
FIG. 2 is a perspective view, partially broken away, of the dispersion plate showing in this specific embodiment of the invention, shapes and locations of passages and a center hole through the output face of the plate for the control and direction of gas vapor flow into the processing apparatus.

Referring now to FIG. 2, there is shown a perspective view, partially broken away of the dispersion plate 20 of FIG. 1, showing its output face 40. As seen in FIG. 2, the face 40 has the annular grooves 42 and 44 and the funnel 46. The groove 42 is somewhat V-shaped and along its bottom intersects the output ends of the multiple passages 30 (only three of which are visible in this view). Similarly, the groove 44 is somewhat V-shaped and along its bottom intersects the output ends of the passages 36 (only some of which are visible). The funnel 46 provides a flared output for the center hole 33. The passages 30, 32, and the hole 33 originate in the entrance 24. The grooves 42, 44, and the funnel 46 blend or mix the individual vapor streams from the passages 30, 32 and the hole 33 into a uniform flow of gas vapor from the plate 20 toward the wafer 16 (see FIG. 1). The grooves 42, 44, and the funnel 46 also eliminate much of the flat part of the surface of the face 40. This, as will be explained in greater detail hereinafter, helps reduce unwanted deposition of solid material on the face 40 instead of on the wafer 16.

Figure 3:
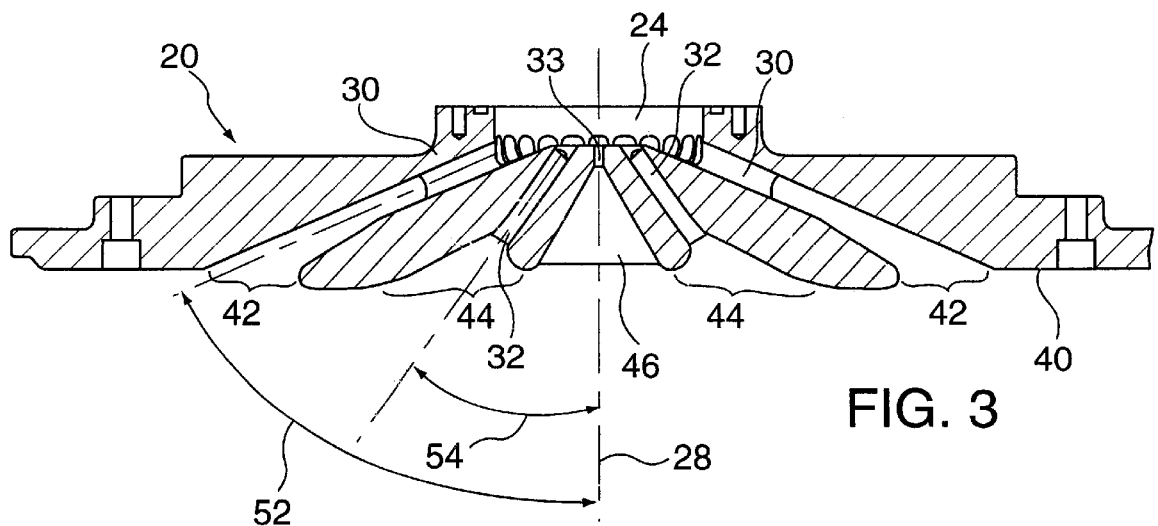
FIG. 3 is a cross-sectional view of the dispersion plate showing separate groups of radially extending gas passages and a center hole through the plate along with the angular relations of the passages to a center axis.

Referring now to FIG. 3 there is shown a cross-section of the dispersion plate 20. The spoke-like outer passages 30 are inclined relative to the center axis 28 by an angle indicated by an arc 52. Each passage 30 extends radially from the entrance 24 to the bottom of the groove 42. The spoke-like inner passages 32 are inclined relative to the center axis 28 by an angle indicated by an arc 54, and each passage 32 extends radially from the entrance 24 to the bottom of the groove 44. The hole 33 and its funnel 46 are aligned along the axis 28.

Figure 4:
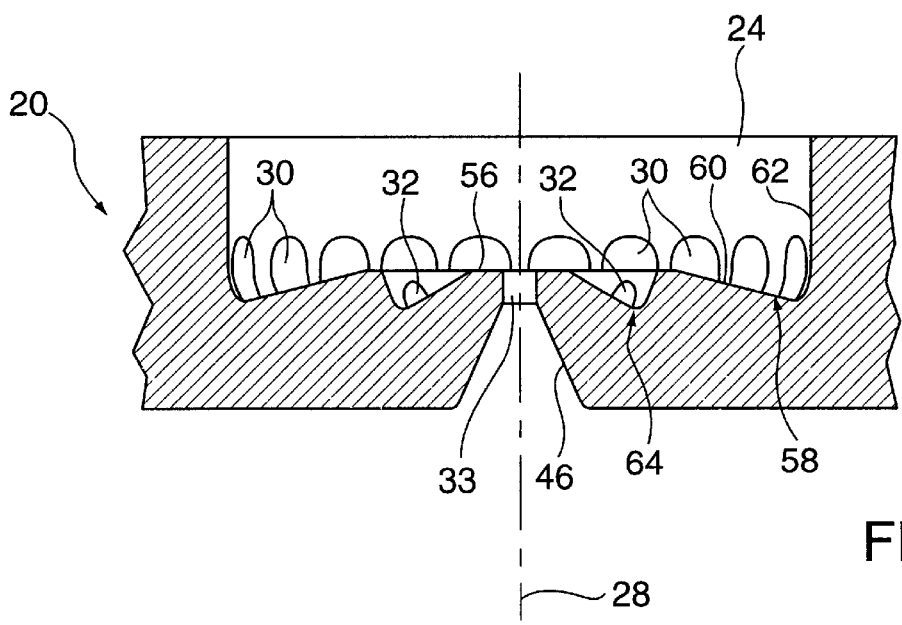
FIG. 4 is an enlarged sectional view partially broken away of the vapor entrance of the dispersion plate of FIGS. 1–3.

Referring now to FIG. 4, there is shown an enlarged cross-section view of the dispersion plate 20 showing further details of the entrance 24, other portions of the plate being broken away. The bottom of the entrance 24 has a flat center surface 56, which is pierced by the center hole 33. The bottom of the entrance 24 has an outer, annular shoulder indicated at 58 comprising a downward-sloping surface 60 and a vertical cylindrical wall 62 into which are formed the passages 30 (see also FIGS. 1 and 3). As was explained previously, these passages 30 extend radially and individually like the spokes of a wheel from the center axis 28. They extend downward at an angle (indicated by the arc 52) into the groove 42 (see also FIG. 2). Similarly, the bottom of the entrance 24 in the plate 20 has an intermediate annular shoulder indicated at 64 into which are formed the passages 32. Like the passages 30, the respective passages 32 also extend radially individually from the center axis 28 and extend downward at an angle, indicated by the arc 54, into their respective groove 44. The provision of the shoulders 58 and 64 in the entrance 24 facilitates the accurate placement and forming of the multiple passages 30 and 32 through the dispersion plate 20.

Figure 5:
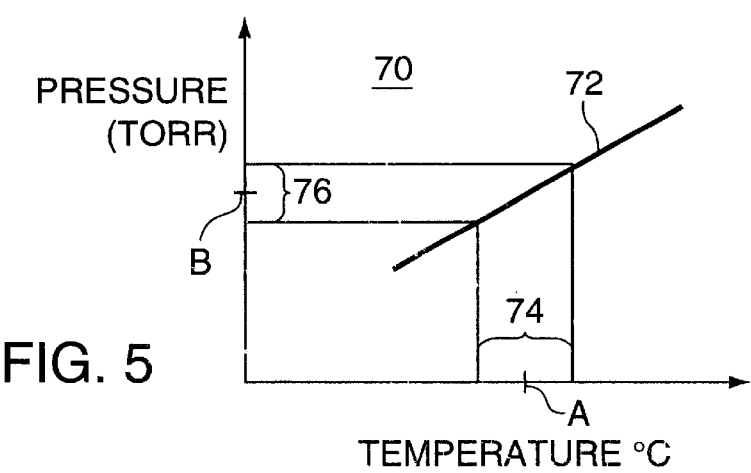
FIG. 5 is a graph with a line illustrating the relationship between vapor phase on one side of the line versus solid phase on the other side for a particular material, such as tungsten hexacarbonyl, as a function of temperature and pressure.

Referring now to FIG. 5, there is shown a graph 70 illustrating the relationship of vapor phase to solid phase of a material such as tungsten carbonyl as a function of temperature versus pressure. The horizontal axis of the graph 70 indicates temperature in degrees Centigrade (° C.), and the vertical axis indicates pressure in Torr. The axes are not necessarily linear. The graph 70 shows a line 72 along which the material is in vapor phase. When the temperature or pressure moves sufficiently to the left or up in the graph 70 away from the line 72, the material returns to solid (or liquid) state. For a given material (e.g., tungsten hexacarbonyl), when being used in CVD processing there are conveniently employed a range of temperatures, indicated in the graph 70 by a bracket 74, and a range of pressures indicated by a bracket 76 with a nominal operating value of temperature at a point A and of pressure at a point B. In the case of tungsten hexacarbonyl, the temperature range 74 may be 80° C. to 100° C. with a nominal operating value at the point A of about 90° C. The pressure range 76 may be a few milli-Torr with an operating value at the point B of about 50 milli-Torr.

It is apparent from the graph 70, that a material such as tungsten hexacarbonyl, when employed in CVD processing in the apparatus 10 requires a low chamber pressure (e.g., about 50 milli-Torr). Such material at normal atmospheric temperature and pressure is a solid but it can be made to sublime into vapor. It is delivered, as indicated by the arrow 26, to the manifold 18 (FIG. 1) It is desirable therefore to prevent the vapor from returning to solid (or liquid) phase in passing from the manifold 18 into and through the dispersion plate 20 that such vapor not be significantly impeded in its flow. Accordingly, the plate 20 should have high-flow-conductance, meaning that the pressure drop across or through it be low (e.g., a few milli-Torr). The plate 20 should also maintain the vapor at a desired temperature (e.g., the temperature value at the point A in the graph 70) as the vapor passes within and through the plate 20. The plate 20 advantageously is made of a metal, such as aluminum, which meets these needs well.

As is shown in FIG. 1, the front face 40 of the plate 20 is positioned at a relatively close distance (e.g., a faction of an inch) from the wafer 16 and its platform 14. During operation of the apparatus 10 the wafer 16 is heated by contact with the platform 14 to an elevated temperature (e.g., 390° C). Heat from the wafer 16 is radiated to the plate face 40, and some of this radiant heat is absorbed by the dispersion plate 20 which raises its temperature. The extent to which the temperature of the plate 20 is raised depends on, among other things, the surface-reflectivity of the face 40. The higher the reflectivity, the lower the absorption of radiated heat and hence lower temperature rise for the plate 20. Where deposition of solid material, such as a thin layer of a tungsten compound, occurs on the face 40 its reflectivity increases substantially. But the presence of the grooves 42 and 44, and the funnel 46 cut into the face 40 of the plate 20 minimizes the deposition of solid material on the face 40. Thus it is possible during CVD processing with a vaporized material such as tungsten hexacarbonyl, to operate the apparatus 10 with the plate 20 at a desired temperature (e.g., 90° C.) maintained at a substantially constant value by radiant heat alone and not affected by changes in surface reflectivity. There is no need under these conditions for an additional heat source for the plate 20. Also, because the passages 30 and 32 and center hole 33 through the plate 20 are relatively large, plasma-excited gas can pass through the plate 20. This makes it possible to place a source for plasma excitation above the entrance 24 in the plate 20 and outside of the chamber 12.

In the specific embodiment of the invention illustrated herein, the diameter of the outer passages 30 in the dispersion plate 20 is about 0.25 inch; the diameter of the inner passages 32 is about 0.15 inch; and the diameter of the center hole 33 is about 0.060 inch. There are twenty-four outer passages 30, twelve inner passages 32 and one center hole 33 for a total of thirty-seven openings for vapor flow through the plate 20 downward and outward from the entrance 24. The inside diameter of the entrance 24 is about two inches and depth about half an inch. The diameter of the dispersion plate 20 between opposite bolts 26 is about 9 inches. The thickness of the plate 20 from the bottom of the entrance 24 to the front face 40 is about an inch. The angle 52 (FIG. 3) is about 70° and the angle 54, about 50°. If the dispersion plate 20 is imagined as the face of a clock, the group of twenty-four passages 30 point respectively to each hour and half-hour (e.g., 12, 12:30, 1, 1:30, etc.) around the clock. The twelve passages 32 point respectively to fifteen minutes after each hour (e.g., 12:15, 1:15, 2:15 etc.) around the clock. Thus, the passages 30 are offset around the center axis 28 by a small angle relative to the passages 32. During CVD processing a flow of vaporized tungsten hexacarbonyl in the range from about 2 to 10 standard cubic centimeters per minute (SCCM) mixed with about 100 SCCM of argon was passed through the plate 20 (maintained at about 90° C.) into the chamber 12 where the pressure was about 50 milli-Torr. The temperature of the wafer 16 was about 390° C. and it was positioned about one-half inch from the face 40 of the plate 20. The processing cycle lasted several minutes.

The above description is intended in illustration and not in limitation of the invention. Various changes or modifications in the dispersion plate 20 embodying features of the invention may occur to those skilled in the art and can be made without departing from the spirit or scope of the invention as set forth herein and as defined by the accompanying claims. For example, the invention is not limited to use with only vaporized tungsten hexacarbonyl but is useful with other vaporized materials. Still further, it is not limited to a particular set of dimensions or diameter of a dispersion plate, or to the particular numbers, sizes and angles of the passages 30 and 32, or the center hole 33, as described above, or to a particular material or method of manufacture for a dispersion plate or to a particular size, shape and number of annular grooves and center funnel in the face of the plate.

What is claimed is:

1. A dispersion plate for applying vapors of materials useful in chemical vapor deposition of layers onto a surface of a semiconductor body, the dispersion plate comprising:

a body having a center axis, an outer diameter, an input face, an output face, and a thickness between the faces;

an entrance along the center axis in the input face for receiving a stream of vaporized material;

the plate defining a plurality of passages therethrough, each passage having a length and a diameter and extending radially from the center axis at respective inclined angles from the input face to the output face; and the plate defining a hole therethrough having a diameter and extending along the center axis from the entrance in the input face to the output face, the hole and plurality of passages having sufficiently large diameters to result in a relatively low pressure drop to vapor flowing through them and to provide dispersion of vapor flowing through the plate such that vapor flows evenly onto the surface of the semiconductor body.

2. The dispersion plate of claim 1 wherein there are a first plurality and a second plurality of passages, the first plurality of passages having respective lengths and diameters greater than the lengths and diameters of the second plurality of passages and lying at respective inclined angles different from the inclined angles of the second plurality of passages.

3. The dispersion plate of claim 2 wherein there are twenty-four passages in the first plurality, and twelve in the second plurality of passages, the diameter of each of the first passages being about 0.25 inch, the diameter of each of the second passages being about 0.15 inch, and the diameter of the hole being about 0.060 inch, such that the plate has high-flow-conductance, and plasma-excited gas can pass through the plate.

4. The dispersion plate of claim 1 wherein the plate is a disc-like block of a metal such as aluminum having high heat conductivity such that vaporized material flowing through the plate can be maintained at a desired temperature to minimize the formation of droplets or particles of the material.

5. The dispersion plate of claim 1 wherein the output face of the plate has formed therein at least one annular groove, the bottom of which intersects respective ones of the passages, the output face having a funnel formed into it and extending to the hole along the center axis, such that gas vapor flowing from the passages and hole is blended into a uniform flow, and unwanted deposition of solid material onto the front face is minimized.

6. A dispersion plate for evenly flowing into a processing chamber a vaporized material such as a tungsten compound during chemical vapor deposition of metal layers onto a semiconductor body, the plate comprising:

a disc-like body having a center axis, an outer diameter, an input face, an output face, and a thickness between the faces;

the disc-like body defining a cup-like entrance along the center axis in the input face for receiving a stream of vaporized material;

the disc-like body defining a first plurality of passages for flow of vapor, each passage having a length and a diameter and extending radially from the entrance like the spokes of a wheel at a first inclined angle relative to the center axis from the input face to the output face;

the disc-like body defining a second plurality of passages for flow of vapor, each passage having a length and a diameter and extending radially from the entrance like the spokes of a wheel at a second inclined angle relative to the center axis from the input face to the output face;

the disc-like body defining a hole therethrough having a flared diameter and extending along the center axis from the entrance in the input face to the output face, the hole and plurality of passages having sufficiently large diameters to cause only low pressure drop to flow of vapor flowing through them; and a first and a second annular groove formed into the output face, the bottom of the first groove intersecting with the first plurality of passages, the bottom of the second groove intersecting with the second plurality of passages, such that streams of vapor flowing through the passages are blended to achieve a relatively even flow of vapor onto the semiconductor body and deposition of solid material on the output face is minimized.

7. The dispersion plate of claim 6 wherein the cup-like entrance has a bottom and a side wall, there being an outer, sloping shoulder and an inner sloping shoulder cut into the bottom at respective angles which facilitate drilling through the plate the first and second passages.

8. The dispersion plate of claim 7 wherein the body is made from a solid block of aluminum such that vapor flowing through the plate can be kept at a desired temperature by the plate.

9. The dispersion plate of claim 6 wherein the first plurality of passages is offset around the center axis by a small angle relative to the second plurality of passages.

10. The dispersion plate of claim 6 wherein the diameter of each of the first plurality of passages is about 0.25 inch, the diameter of each of the second plurality of passages is about 0.15 inch, and the plate is about an inch thick and about 9 inches in diameter.

11. Apparatus for processing of semiconductor wafers, the apparatus comprising:

a processing chamber which can be maintained at sub-atmospheric pressure;

a platform or susceptor within the chamber for holding a wafer during processing; and a dispersion plate for flowing into the chamber and onto a wafer vaporized material for chemical vapor deposition of a solid film onto the wafer, the plate comprising:

a disc-like body having a center axis, an outer diameter, an input face, and output face, and a thickness between the faces;

an entrance along the center axis in the input face for receiving a stream of vaporized material;

the body defining a plurality of passages through the plate for flow of vaporized material, each passage having a length and a diameter and extending radially like spokes of a wheel from the center axis at respective inclined angles from the input face to the output face; and the body defining a hole therethrough having a diameter and extending along the center axis from the entrance in the input face to the output face, the hole and plurality of passages having sufficiently large diameters to give minimal pressure drop to the vaporized material flowing through them and to provide dispersion of flow through the plate such that vaporized material flows evenly onto a wafer surface.

12. The apparatus of claim 11 wherein the wafer is heated to about 400° C., the vaporized material is a metal compound such as tungsten hexacarbonyl, the dispersion plate has high thermal conductivity and is held at about 90° C., and the pressure within the chamber is about 50 milli-Torr.

13. The apparatus of claim 12 wherein the dispersion plate is held at about 90° C. by heat radiated from the wafer and susceptor.

14. Apparatus for chemical vapor deposition (CVD) of metal films onto semiconductor wafers, the apparatus comprising:

a processing chamber which can be maintained at pressures of less than a Torr;

a platform within the chamber for holding and heating a wafer during processing; and a dispersion plate for flowing into the chamber and onto a wafer vaporized metal compound for chemical vapor deposition of a metal film onto a wafer;

the plate comprising:

a disc-like body having a center axis, an outer diameter, an input face, and output face, and a thickness between the faces;

an entrance along the center axis in the input face for receiving a stream of the vaporized material from an external source;

the body defining a first plurality of passages for flow of vapor, each passage having a length and a diameter and extending radially from the entrance like the spokes of a wheel at a first inclined angle relative to the center axis from the input face to the output face;

the body defining a second plurality of passages for flow of vapor, each passage having a length and a diameter and extending radially from the entrance like the spokes of a wheel at a second inclined angle relative to the center axis from the input face to the output face;

the body defining therethrough a hole having a flared diameter and extending along the center axis from the entrance in the input face to the output face, the hole and plurality of passages having sufficiently large diameters to cause only minimal pressure drop to flow of vapor flowing through them; and a first and a second annular groove formed into the output face, the bottom of the first groove intersecting with the first plurality of passages, the bottom of the second groove intersecting with the second plurality of passages, such that streams of vapor flowing through the passages are blended to achieve more even flow of vapor onto a semiconductor wafer and deposition of solid material on the output face is minimized.

15. The apparatus of claim 14 wherein there are several dozen passages in the first plurality and about a dozen in the second plurality of passages, the diameter of each of the passages in the second plurality being smaller than that of each of the passages in the first plurality and larger than that of the hole, such that the flow of vaporized material is balanced and even.

16. The apparatus of claim 14 wherein the cup-like entrance has a bottom with an outer angular shoulder and an intermediate angular shoulder, the shoulders providing respective entrances for the first and second plurality of passages.

* * * * *